United States Patent [19]

Kandybowski

[11] Patent Number: 5,261,828

[45] Date of Patent: Nov. 16, 1993

[54] MISALIGNMENT TOLERANT EDGE CONNECTOR ASSEMBLY

[75] Inventor: Steven J. Kandybowski, Tower City, Pa.

[73] Assignee: The Whitaker Corporation, Wilmington, Del.

[21] Appl. No.: 935,934

[22] Filed: Aug. 27, 1992

[51] Int. Cl.⁵ .......................................... H01R 23/70
[52] U.S. Cl. ........................................ 439/79; 439/247
[58] Field of Search .................. 439/79, 80, 67, 77, 439/247, 248

[56] References Cited

U.S. PATENT DOCUMENTS 4,850,885  7/1989  Schell .................................. 439/247
5,090,911  2/1992  Welsh .................................. 439/248

Primary Examiner—Neil Abrams
Attorney, Agent, or Firm—William B. Noll

[57] ABSTRACT

An edge mounted connector assembly for a printed circuit board (10) wherein the connector block (22) which mates with a connector receptacle on a mother board (12) is connected to the printed circuit board (10) by means of a flexible circuit member (44). A cover member (30) is mounted on the connector block (22) in such a manner that it is free to move relative to the connector block (22) in a first direction. The printed circuit board (10) is mounted to the cover member (30) in such a manner that it is free to move relative to the cover member in a second direction orthogonal to the first direction. The flexible circuit member (44) is free to flex in both directions.

8 Claims, 4 Drawing Sheets

MISALIGNMENT TOLERANT EDGE CONNECTOR ASSEMBLY

BACKGROUND OF THE INVENTION

This invention relates to a connector assembly for the edge mounting of a daughter board on a mother board and, more particularly, to such an assembly which is tolerant of misalignment of the daughter board.

In large electronic systems, there is typically provided a mother board, or backplane, to which is mounted a plurality of daughter boards. The mother board may include its own electronic circuitry, may have distribution circuits for interconnecting the daughter boards, or may include some combination of both. In common usage, the mother board has mounted thereon a plurality of connector receptacles and each daughter board has a connector assembly adapted to be received within a respective connector receptacle on the mother board so that the daughter boards can be edge mounted orthogonally to the mother board. There are certain applications wherein the housing for the electronic circuitry has fixed guides for the daughter boards. In such an application, when a daughter board is moved along its guide toward the mother board, there may not be a perfect alignment between the connector assembly on the daughter board and the connector receptacle on the mother board.

It is therefore a primary object of the present invention to provide a connector assembly for a daughter board which is tolerant of such misalignment and is capable of mating with the connector receptacle on the mother board even when there is such misalignment.

It is another object of this invention to provide a connector assembly which accommodates such misalignment in two orthogonally related directions.

SUMMARY OF THE INVENTION

The foregoing and additional objects are attained in accordance with the principles of this invention by providing an edge mounted connector assembly for a printed circuit board wherein the connector block which mates with a connector receptacle on a mother board is connected to the printed circuit board by means of a flexible circuit member. The flexible circuit member includes an array of contact pads adapted for connection to respective contact pads on the printed circuit board and conductive traces on its surface extend from its contact pads for connection to respective contact members disposed in passageways in the connector block. The printed circuit board is mounted to the connector block through a cover member. The mounting of the printed circuit board to the cover member accommodates misalignment in a first direction and the mounting of the cover member to the connector block accommodates misalignment in a second direction orthogonal to the first direction.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 4:
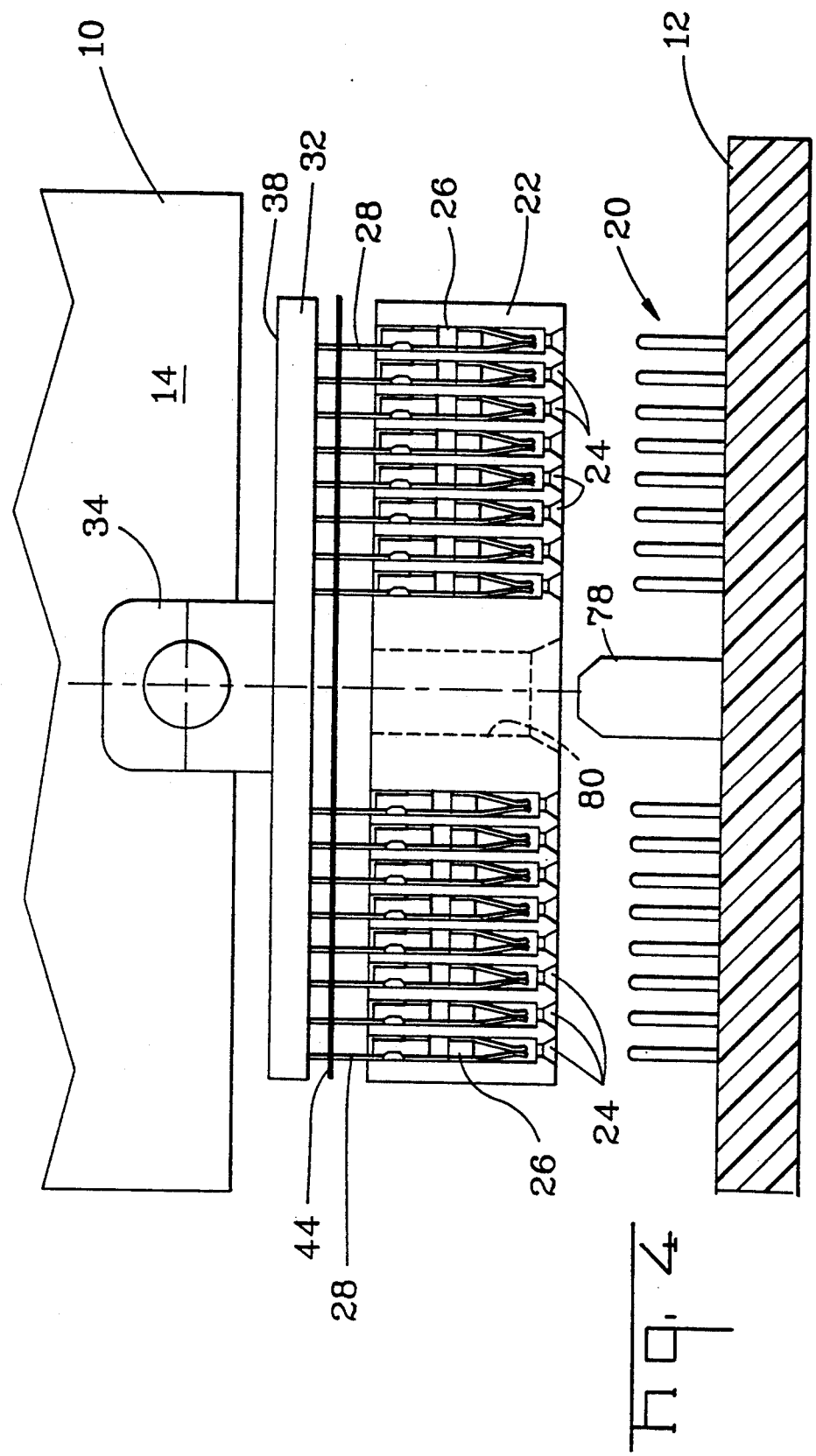
FIG. 4 is a partially exploded schematic side view of the assembly of FIG. 1 when the daughter board is properly aligned.

Referring now to the drawings, a printed circuit board 10 is to be orthogonally edge mounted to a mother board 12 by the connector assembly according to this invention. The printed circuit board 10 has a first planar surface 14 and a second planar surface 16 parallel to and spaced from the surface 14. An array of contact pads 18 is disposed on the first surface 14 and a similar array of contact pads (not shown) is disposed on the second surface 16. As is conventional, the mother board 12 is provided with a receptacle commonly referred to as a pin header. In FIG. 4, the pins 20 of the pin header are shown without the surrounding shroud.

To mate with the pin header on the mother board 12, the printed circuit board is provided with a connector assembly. According to this invention, the connector assembly includes a connector block 22 having a plurality of parallel passageways 24 therethrough. The passageways 24 are registrable with the pins 20. Within each of the passageways 24 is a contact member 26, each of which is adapted for mating engagement with a respective one of the pins 20, as is conventional in the art. At the end of each contact member 26 which is opposite from the end which mates with a pin 20, the contact member 26 is formed with a tail portion 28 which extends out of the connector block 22.

The connector assembly according to the present invention further includes a cover member 30 having a generally planar plate portion 32 and a pair of generally planar and parallel lugs 34, 36 extending orthogonally from a first surface 38 of the plate portion 32. The plate portion 32 is formed with a plurality of passageways 40 extending toward its first surface 38 from an opposed second surface 42. The passageways 40 correspond to, and are registrable with, the passageways 24 of the connector block 22 and are adapted to contain the tail portions 28 of the contact members 26, as is clear from FIGS. 2 and 3.

Figure 1:
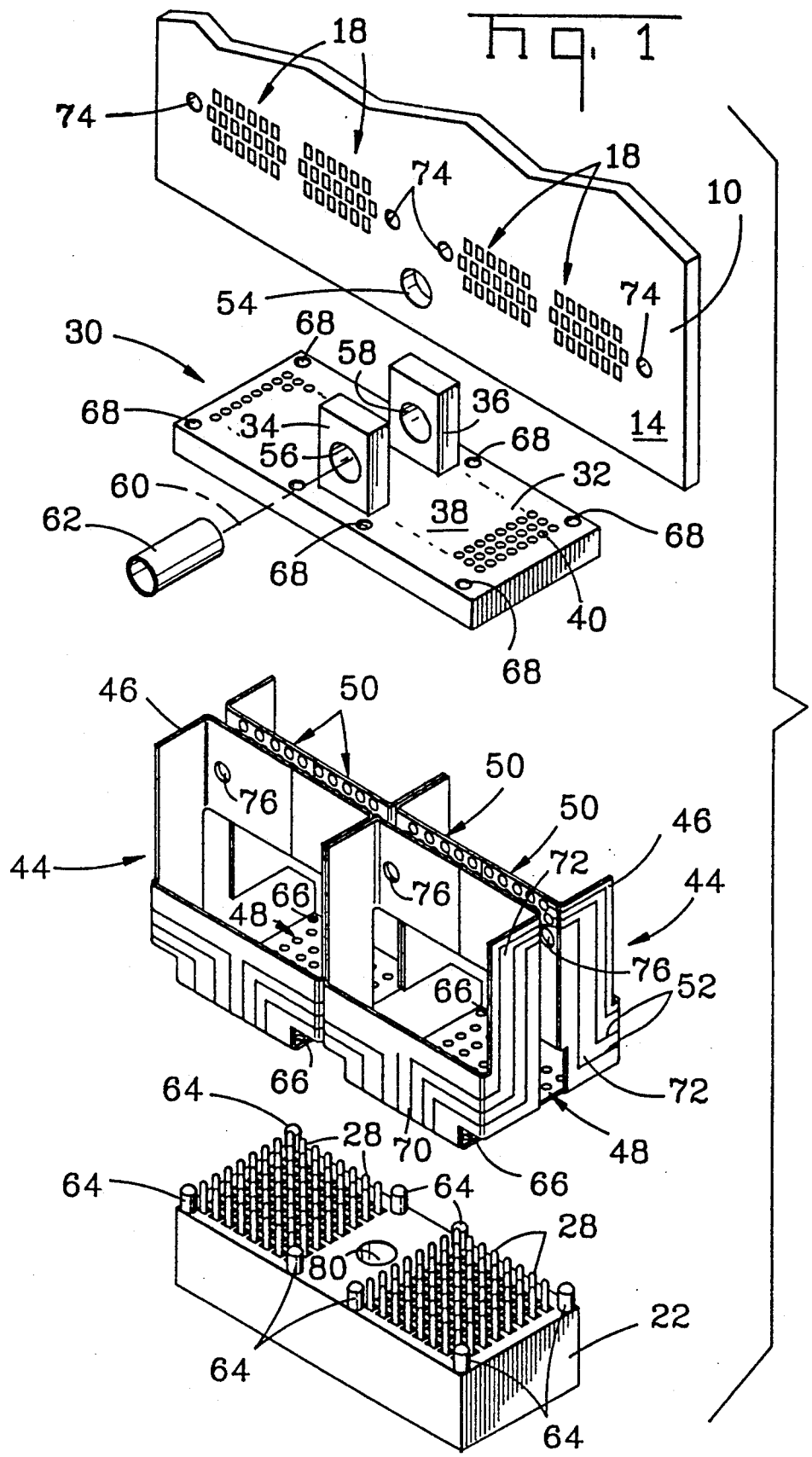
FIG. 1 is an exploded perspective view of a connector assembly according to the present invention.

To provide electrical connections between the contact pads 18 on the printed circuit board 10 and the contact members 26 in the connector block 22, there is provided a flexible circuit member 44. FIG. 1 illustrates two identical flexible circuit members 44 disposed side-by-side. Each flexible circuit member 44 comprises a mylar substrate 46 with conductive material, typically copper, deposited thereon for providing conductive paths on the substrate 46. The circuit member 44 is formed with a plurality of apertures 48 which correspond to, and are registrable with, the passageways 24 of the connector block 22 so that the tail portions 28 of the contact members 26 can extend therethrough. Deposited on a surface of the substrate 46 remote from the apertures 48 are a plurality of contact pads 50 corresponding to, and registrable with, the contact pads 18 on the printed circuit board 10. Preferably, the circuit member 44 has two groups of contact pads 50 for engaging the contact pads 18 on both sides of the printed circuit board 10. Also deposited on the substrate 46 is a plurality of conductive traces 52 which extend from respective ones of the contact pads 50 to respective ones of the apertures 48.

Figure 2:
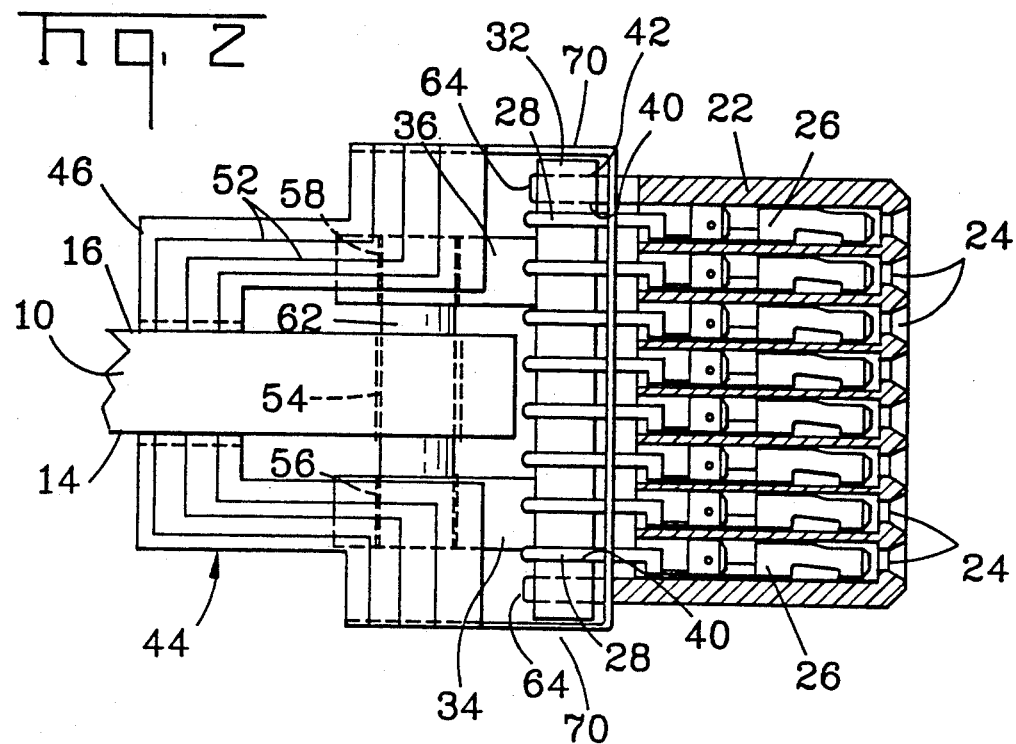
FIG. 2 is an end view of the assembly shown in FIG. 1 when the daughter board is properly aligned.
Figure 3:
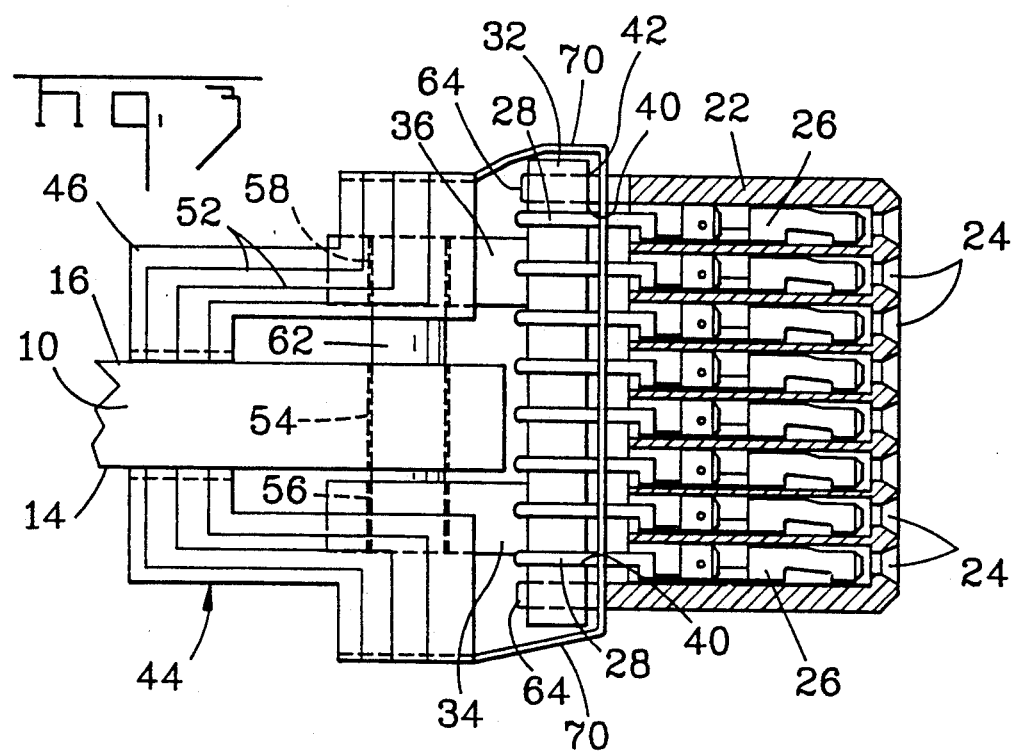
FIG. 3 is a view similar to FIG. 2 when the daughter board is misaligned to the left.

For assembly, the printed circuit board 10 is formed with a bore 54 which extends through the printed circuit board 10 orthogonally from the first surface 14 to the second surface 16. The lugs 34 and 36 are formed with respective coaxial bores 56 and 58 wherein the common axis 60 of the bores 56 and 58 is parallel to the plane of the plate portion 32 and orthogonal to the planes of the lugs 34 and 36. A pin member 62 is provided which is adapted for insertion through the bores 56, 58 and 54, with the circuit board lo being between the lugs 34 and 36, as best illustrated in FIGS. 2 and 3.

The connector block 22 is formed with a plurality of parallel posts 64 which extend toward the cover member 30. To accommodate the posts 64, the substrate 46 of the flexible circuit member 44 is formed with a plurality of apertures 66 and the plate portion 32 is formed with a plurality of bores 68. For reasons that will be apparent from the following discussion, the bores 68 are elongated in a direction orthogonal to the common axis 60.

To accommodate the aforedescribed misalignment of the printed circuit board 10 relative to its pin header on the mother board 12, the flexible circuit member 44 is shaped so that it has web portions 70 which will be transverse to the common axis 60 after assembly and web portions 72 which will be parallel to the common axis 60 after assembly. The web portions 70, 72 provide the misalignment tolerance, as will be described hereinafter.

To assemble the inventive connector assembly, the flexible circuit member 44 is placed on the connector block 22 with the tail portions 28 of the contact members 26 extending through respective ones of the apertures 48 and the posts 64 extending through respective ones of the apertures 66. It will be recalled that the tail portions 28 extend through the apertures 48 at which the conductive traces 52 terminate. A soldering operation is then performed to connect the ends of the conductive traces 52 to respective ones of the tail portions 28. The cover member 30 is placed over the flexible circuit member 44 with the posts 64 extending through the bores 68 and the tail portions 28 of the contact members 26 extending into the passageways 40. The printed circuit board 10 is placed between the lugs 34 and 36 and the pin member 62 is inserted through the bores 56, 54 and 58. The contact pads 50 on the flexible circuit member 44 are then soldered to respective ones of the contact pads 18 on the printed circuit board 10. Thus, the printed circuit board contact pads 18 are electrically connected to respective ones of the contact members 26 through the flexible circuit member 44. In order to provide strain relief, the printed circuit board 10 may be provided with openings 74 aligned with respective openings 76 in the flexible circuit member 44, through which appropriate pins may be inserted.

Figure 5:
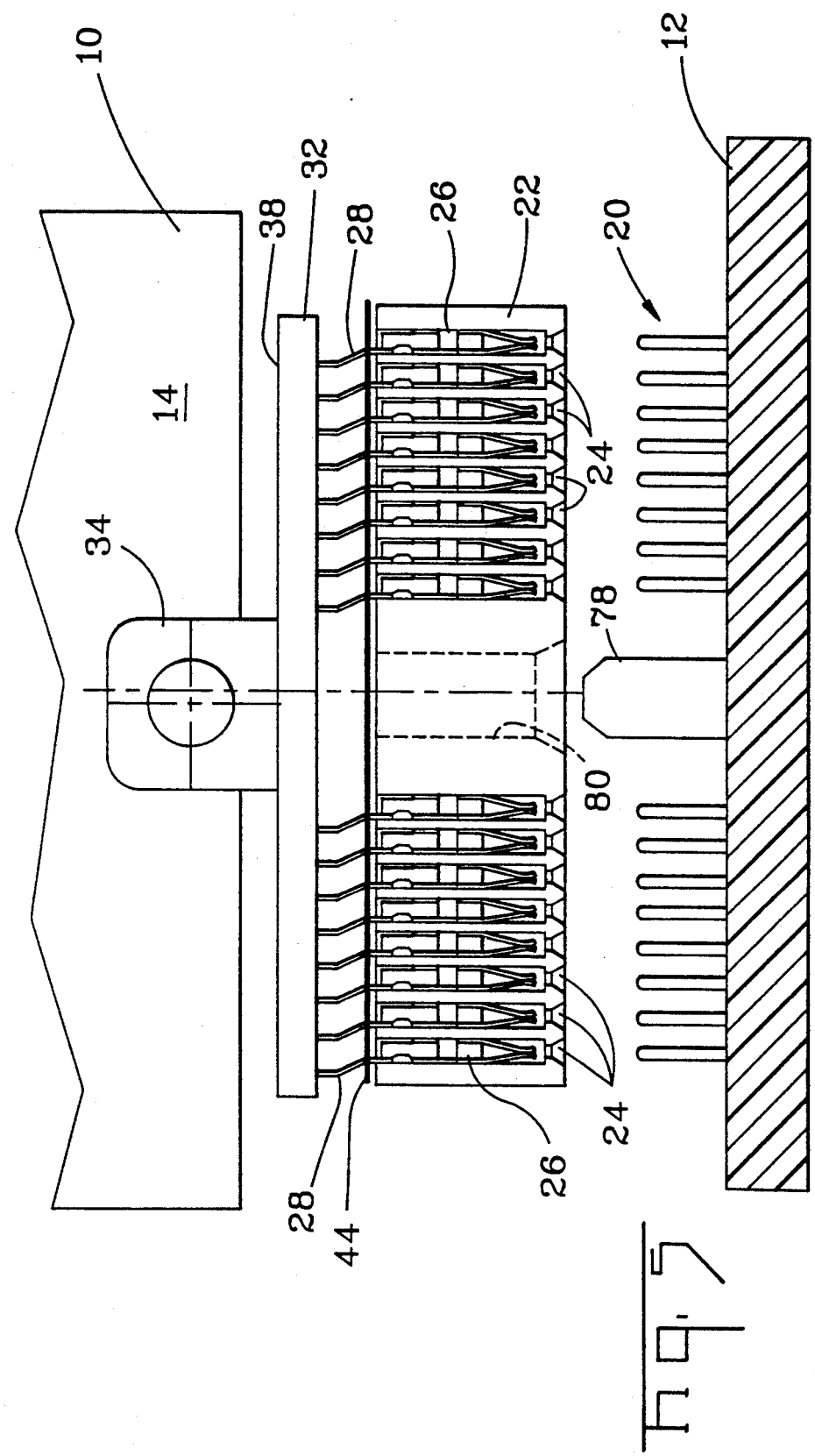
FIG. 5 is a view similar to FIG. 4 when the daughter board is misaligned to the left.

The aforedescribed connector assembly is adapted for installation in a pin header on a mother board, both of which are fixed. The inventive connector assembly is capable of accommodating misalignment of the printed circuit board 10 in a first direction along the common axis 60 and in a second direction orthogonal to the common axis 60. As shown in FIGS. 4 and 5, the pin header on the mother board 12 is provided with a locator pin 78 and the connector block 22 is formed with a locator bore 80. The locator pin 78 and the locator bore 80 are beveled at their ends so that there can be an initial misalignment between the connector block 22 and the pin header. Movement of the connector block 22 toward the pin header results in entry of the locator pin 78 into the locator bore 80. There is subsequent movement of the connector block 22 within a plane orthogonal to the axis of the locator pin 78 and into alignment with the pin header, so that the pins 20 properly enter the appropriate passageways 24.

As shown in FIGS. 2 and 3, according to this invention there can be relative movement between the printed circuit board 10 and the connector block 22 along the common axis 60, as limited by the spacing between the lugs 34 and 36 and the thickness of the board 10. Upon such movement, the web portions 70 of the flexible circuit member 44 flex to take up such movement while still maintaining the connections between the contact pads 18 on the printed circuit board 10 and the contact members 26. As shown in FIGS. 4 and 5, when the printed circuit board 10 is misaligned in a direction orthogonal to the common axis 60, there can be relative movement between the connector block 22 and the printed circuit board 10 along with the cover member 30 in that direction within limits set by the length of the elongated bores 68. At this point, it is noted that the tail portions 28 of the contact members 26 are generally planar in planes parallel to the common axis 60 so that, as shown in FIG. 5, the tail portions 28 are bendable out of their planes when the connector block 22 moves orthogonal to the common axis 60. Such movement causes the web portions 72 of the flexible circuit member 44 to flex and still maintain the connections between the contact pads 18 on the printed circuit boards 10 and the contact members 26. It will be appreciated that misalignment in a direction which has a component parallel to the common axis 60 as well as a component orthogonal to the common axis 60 is accommodated by the connector assembly according to this invention.

Accordingly, there has been disclosed an improved connector assembly for the edge mounting of a daughter board on a mother board which is tolerant of two directions of misalignment of the daughter board. While an exemplary embodiment has been disclosed herein, it will be appreciated by those skilled in the art that various modifications and adaptations to the disclosed embodiment may be made and it is only intended that this invention be limited by the scope of the appended claims.

I claim:

1. An edge mounted connector assembly for a printed circuit board (10) having first and second opposed planar surfaces (14, 16) and wherein the printed circuit board has a first array of contact pads (18) on said first surface and a bore (54) extending through said printed circuit board orthogonally from said first surface to said second surface, the assembly comprising:
   a connector block (22) having a plurality of parallel passageways (24) therethrough;
   a plurality of contact members (26) each disposed in a respective one of said passageways (24) and each having a tail portion (28) extending out of said connector block (22);
   a cover member (30) having a generally planar plate portion (32) and a pair of generally planar and parallel lugs (34, 36) extending orthogonally from a first surface (38) of said plate portion, said plate portion being formed with a plurality of passageways (40) extending toward its first surface (38) from an opposed second surface (42), said plate portion passageways corresponding to and registrable with said connector block passageways and adapted to contain said contact member tail portions, said lugs being formed with respective coaxial bores (56, 58) wherein the common axis (60) of said bores is parallel to the plane of said plate portion and orthogonal to the planes of said lugs;

a flexible circuit member (44) interposed between said cover member and said connector block, said circuit member including a flexible substrate (46) having a first plurality of apertures (48) corresponding to and registrable with said connector block passageways, said tail portions of said contact members extending through respective ones of said first plurality of apertures of said circuit member, said circuit member further including a first plurality of contact pads (50) on a first surface corresponding to and registrable with said first array of printed circuit board contact pads (18), said circuit member first plurality of contact pads (50) being adapted for connection to respective circuit board contact pads in said first array, said circuit member further including a first plurality of conductive traces (52) on said first surface extending from respective ones of said first plurality of contact pads (50) to respective ones of said first plurality of apertures (48), and said first plurality of conductive traces being adapted for connection to respective contact member tail portions (28); and a pin member (62) extending through said cover member lug bores (56, 58) and said printed circuit board bore (54).

2. The assembly according to claim 1 wherein:
said printed circuit board (10) has a second array of contact pads (18) on said circuit board second surface (16); and
said flexible circuit member (44) includes a second plurality of contact pads (50) on said first surface corresponding to and registrable with said second array of printed circuit board contact pads and a second plurality of conductive traces (52) on said first surface extending from respective ones of said second plurality of contact pads to respective ones of said first plurality of apertures (48), said circuit member second plurality of contact pads (50) being adapted for connection to respective circuit board contact pads (18) in said second array, and said second plurality of conductive traces being adapted for connection to respective contact member tail portions (28).

3. The assembly according to claim 1 wherein:
said connector block (22) includes a plurality of parallel posts (64) extending toward said cover member (30);
said flexible circuit member substrate (46) is formed with a second plurality of apertures (66) each receiving a respective post (64) therethrough; and
said cover member plate portion (32) is formed with a plurality of bores (68) each receiving a respective post therein.

4. The assembly according to claim 3 wherein said cover member plate portion post receiving bores (68) are elongated in a direction orthogonal to said common axis (60) so that said connector block (22) is movable relative to said cover member (30) together with said printed circuit board (10) in said direction within limits set by the lengths of said elongated post receiving bores (68), said flexible circuit member (44) maintaining the connections between said contact members (26) and said printed circuit board contact pads (18) during movement in said direction by said connector block (22).

5. The assembly according to claim 4 wherein said contact member tail portions (28) are generally planar in planes parallel to said common axis (60) so that said tail portions are bendable out of their planes during movement in said direction by said connector block (22).

6. The assembly according to claim 4 wherein said flexible circuit member (44) includes a web portion (72) extending between said cover member (30) and said printed circuit board (10), said web portion being parallel to said common axis (60) of the bores (56, 58, 54) of said lugs (34, 36) and said printed circuit board (10).

7. The assembly according to claim 1 wherein the spacing between said cover member lugs (34, 36) is greater than the thickness of said circuit board (10) between its first and second surfaces (14, 16) so that said printed circuit board (10) is relatively movable between said lugs along said pin member (62), said flexible circuit member (44) maintaining the connections between said contact members (26) and said printed circuit board contact pads (18) during relative movement of said printed circuit board along said pin member.

8. The assembly according to claim 7 wherein said flexible circuit member (44) includes a web portion (70) extending between said cover member (30) and said printed circuit board (10), said web portion (70) being transverse to said common axis (60) of the bores (56, 58, 54) of said lugs (34, 36) and said printed circuit board (10).

* * * * *